United States Patent [19]
Esses

[11] Patent Number: 6,130,173
[45] Date of Patent: Oct. 10, 2000

[54] RETICLE BASED SKEW LOTS

[75] Inventor: Donald J. Esses, San Jose, Calif.

[73] Assignee: LSI Logic Corporation, Milpitas, Calif.

[21] Appl. No.: 09/045,738

[22] Filed: Mar. 19, 1998

[51] Int. Cl.$^7$ ................................................ H01L 21/00
[52] U.S. Cl. ........................... 438/942; 438/942; 430/5; 430/316; 430/396
[58] Field of Search ........................... 438/942; 430/396, 430/316, 5

[56] References Cited

U.S. PATENT DOCUMENTS

| | | |
|---|---|---|
| 4,901,242 | 2/1990 | Kotan . |
| 4,967,229 | 10/1990 | Akutagawa . |
| 5,017,514 | 5/1991 | Nishimoto . |
| 5,111,404 | 5/1992 | Kotani . |
| 5,319,564 | 6/1994 | Smayling et al. . |
| 5,328,560 | 7/1994 | Hanawa et al. . |
| 5,338,397 | 8/1994 | Sanders . |
| 5,402,367 | 3/1995 | Sullivan et al. . |
| 5,438,527 | 8/1995 | Feldbaumer et al. . |
| 5,646,870 | 7/1997 | Krivokapic et al. ..................... 364/578 |
| 5,655,110 | 8/1997 | Krivokapic et al. ..................... 395/500 |
| 5,824,437 | 10/1998 | Sakakibara et al. . |
| 5,828,573 | 10/1998 | Hayashi . |
| 5,853,921 | 12/1998 | Moon et al. . |
| 5,886,906 | 3/1999 | Tatsumi et al. . |
| 5,926,690 | 7/1999 | Toprac et al. . |
| 5,943,237 | 8/1999 | Van Boxem . |
| 5,949,986 | 9/1999 | Riley et al. . |
| 5,998,071 | 12/1999 | King et al. . |

OTHER PUBLICATIONS

White et al, "Evaluation of a two–mask resolution enhancement technique," J. Vac. Sci. Technol. B 16(6), pp. 3411–3414, Nov. 1998.

Kamon et al, "Experimental and simulated estimation of new super resolution technique," J. Vac. Sci. Technol. B 14(6), ppg. 4171–4174, Nov. 1996.

Wolf, "Silicon Processing for the VLSI Era vol. I," ppg. 459–491, 1986.

Wolf, "Silicon Processing for the VLSI Era vol. II," ppg. 324–327, 1990.

Kizilyalli et al, "Predictive worst case statistical modeling of 0.8 micron BICMOS bipolar transistors: a methodology based on process and mixed device/circuit level simulators," IEEE Trans. on Electr. Devic., vol. 40, No. 5, ppg. 966, May 1993.

*Primary Examiner*—John F. Niebling
*Assistant Examiner*—Jonathan Hack
*Attorney, Agent, or Firm*—Beyer Weaver & Thomas, LLP

[57] ABSTRACT

A process of forming on an integrated circuit substrate at least two different gate masks having different lengths is described. The process includes: (i) providing the integrated circuit substrate having a surface; (ii) depositing on the surface a gate layer; and (iii) masking portions of the gate layer using a reticle having at least two die patterns including a first die pattern defining an image of a first gate electrode having a first length and a second die pattern defining an image of a second gate electrode having a second length, the first length being different from the second length and relative positioning of the image of the first gate electrode in the first die pattern and of the image of second gate electrode in the second die pattern is substantially similar.

23 Claims, 5 Drawing Sheets

RETICLE BASED SKEW LOTS

BACKGROUND OF THE INVENTION

The present invention relates to reticle based skew lots. More particularly, the present invention relates to generating skew lots on a single semiconductor wafer by using a reticle that has different magnitudes of a critical dimension, e.g., gate length.

High density integrated circuits are currently mass-produced with several critically-dimensioned features, e.g., transistor gate length, channel width, trench depth, etc. FIG. 1 shows a portion of a partially fabricated die 10 including an "L" shaped gate electrode 14 of a Metal Oxide Semiconductor (MOS) transistor device on a substrate 12 having a length 16 (labeled as "λ" and hereafter referred to as gate length). It is well known to those skilled in the art that gate length 16 is primarily responsible for determining the maximum transistor switching speed, overall device operating speed and performance of the transistor device. By way of example, the gate length 16 in a 0.25 μm technology is ideally about 0.25 μm and similarly in a 0.35 μm technology is ideally about 0.35 μm.

However, due to process variations during a semiconductor fabrication process, for example, gate length 16 may frequently vary from the ideal or target gate length value of 0.35 μm to gate lengths that may be as low as about 0.30 μm and may be as high as about 0.40 μm or more. It is, therefore, desirable to produce die having gate lengths within a tolerance range, i.e. the range of deviation of an actual gate length from the target gate length that allows the transistor device to function effectively and have speeds above an acceptable threshold.

In order to ensure that deviations from the target value of the gate length do not adversely impact the speed or performance of the transistor and fall below the acceptable threshold, the semiconductor fabrication facilities or their customers, e.g., users of die or semiconductor chips, generate wafer skew lots or process corner lots. The term "wafer lot" commonly refers to wafers that are secured on a wafer cassette and processed together under relatively similar conditions. The term "wafer skew lots," as used in connection with the description of this invention, refers to a plurality of wafer lots, in which the value of a critical dimension, varies from one wafer lot to another. In order to produce a different gate length, for example, the wafer lot is processed under different processing conditions or employs a different reticle during a masking step. In other words, in wafer skew lots, a critical dimension, such as a transistor gate length, is skewed from one wafer lot to another to characterize the performance and speed of the transistor devices at different values of the critical dimension.

The term "process corner lots" refers to wafer lots that have gate lengths at various process corners, which are explained in detail hereinafter. As mentioned above, the gate length from one wafer lot to another may purposely be varied to reflect the variations produced by the process during commercial wafer production. By way of example, one wafer lot is processed so that its transistor gate lengths have little or no difference from the target gate length and such processing of the wafer lot may be characterized in the semiconductor art as being conducted at a "typical" or "nominal" process point. As another example, another wafer lot may be processed to have the largest gate length encountered due to process variations relative to the target gate length, e.g., about 10% larger than the target gate length, and the processing of this wafer lot may be characterized in the art as being conducted at a "worst" case point. As yet another example, yet another wafer lot may be processed to have the smallest gate lengths encountered due to process variations relative to the target gate length, e.g., about 10% smaller than the target gate length, and the processing of this wafer lot may be characterized as being conducted at a "best" case point. Process corners are, therefore, the various process points, e.g., nominal or typical process point, worst case point and best case point and process corner lots refer to wafer lots processed at these various process corners.

FIG. 2 is a flowchart of a current process 20 of fabricating wafer skew lots or process corner lots using different reticles. Before process 20 begins, a gate oxide layer, e.g., silicon dioxide layer, is typically grown on the wafer surfaces of a wafer lot. A step 22 includes blanket depositing a gate layer, e.g., a polysilicon layer, above the wafer surfaces of a wafer lot according to conventional methods well known to those skilled in the art.

Next a step 24 includes obtaining conventional reticles employed during photolithography to define masks which protect specified regions of a semiconductor wafer from etching. A reticle used in this step includes patterns defining gate electrodes, which have identical values of a critical dimension, such as a gate length, throughout the reticle and the gate lengths on the reticle may target a specific process corner, e.g., nominal process point, worst case point or best case point. The wafers in a wafer lot are processed using the same reticle and may therefore have gate lengths that are similar from die to die on the wafer surfaces of the wafer lot. However, the gate lengths vary from one wafer lot to another because a different reticle is employed for a different wafer lot. In subsequent steps of process 20, the pattern of the reticle employed is transferred on the gate layer by conventional photolithography techniques described below.

A step 26 then includes forming a gate mask on portions of the gate layer using the conventional reticle mentioned above. In this step, a masking layer, e.g., a photoresist layer, is typically deposited on the gate layer. A light source, e.g., ultraviolet light source, then shines through the reticle on to the wafer surface to form on the gate layer a mask having the image of the gate electrode pattern (hereinafter referred to as "gate mask") of the reticle. As a result, the dimensions of the gate mask formed in this step are dictated by the specific process corner targeted by the reticle.

A step 28 includes etching the unmasked portions of the gate layer to form gate electrodes on wafers. In this step, etchants are introduced on the wafer surface to facilitate etching of the unmasked portions of the gate layer or the wafer is placed in a plasma chamber where the unmasked portions of the gate layer undergo dry etching. After, etching has concluded, the photoresist remaining above the protected portions is removed by wet chemistry or ashing. In this manner, different reticles that target different process corners can be used for fabricating wafer skew lots, e.g., one wafer lot is processed at the nominal point, another wafer lot is processed at the worse case point and yet another wafer lot is processed at the best case point.

After the skewed wafer lots are fabricated as described above, they are tested to characterize device speed and performance at the various process corners, e.g. nominal, worse and best case points. This enables the semiconductor fabrication facility or the end user of the die to understand the interaction of the device with other devices on a printed circuit board or system and ascertain the best case performance of the device.

Unfortunately, the process of generating skewed wafer lots suffers from several drawbacks. By way of example, the process of generating skewed wafer lots described above is expensive because it requires fabricating a wafer lot for each process corner. For example, if the nominal, best and worse case points are under consideration, then three wafer lots are processed (one wafer lot for each process corner). This can also be a time-consuming task, lowering the throughput of the semiconductor fabrication process.

As another example, one wafer lot is typically run separately from another and therefore it is likely that a variable affecting the performance of one wafer lot and not the other may be introduced. In this case, of course, it would difficult to correlate the speed or performance of the device to its gate length alone.

As yet another example, in the case where a process is biased to form a gate length that varies from the ideal or target gate length, variations in the process cannot ensure that the desired gate length will be produced.

What is therefore needed is an improved process of generating skew lots without suffering from the drawbacks of the current process of generating wafer skew lots.

SUMMARY OF THE INVENTION

To achieve the foregoing, the present invention provides a process of forming on an integrated circuit substrate at least two different gate masks having different lengths. The process includes: (i) providing the integrated circuit substrate having a surface; (ii) depositing on the surface a gate layer; and (iii) masking portions of the gate layer using a reticle having at least two die patterns including a first die pattern defining an image of a first gate electrode having a first length and a second die pattern defining an image of a second gate electrode having a second length, the first length being different from the second length and relative positioning of the image of the first gate electrode in the first die pattern and of the image of second gate electrode in the second die pattern is substantially similar.

The process may further include etching unmasked portions of the gate layer to form on the integrated circuit substrate at least two die including a first die having the first gate electrode with a first gate length and a second die having a second gate electrode with a second gate length, the first gate length being different from the second length. The process may further still include a step of labeling the first and second die at a scribe region near or on the first and second die based on the first gate length of the first gate electrode and the second gate length of the second gate electrode. Further still, the process may include: cutting the substrate into units of die; packaging the first and second die; and testing the first and second die to obtain die performance data. The gate layer may include a polysilicon layer and may be deposited on a gate oxide that is grown on the substrate surface.

In the step of masking portions of the gate layer, the reticle may further include a third die pattern defining an image of a third gate electrode having a third length and a fourth die pattern defining an image of a fourth gate electrode having a fourth length such that the first, second, third and fourth lengths are different from each other and relative positioning of the image of the first gate electrode in the first die pattern, the image of the third gate electrode in the third die pattern and the image of the fourth gate electrode in the fourth die pattern are substantially similar. Furthermore, the step of etching unmasked portions of the gate layer may include forming on the integrated circuit substrate along with the first and second die, a third die having the third gate electrode with a third gate length and a fourth die having the fourth gate electrode with a fourth gate length such that first, second, third and fourth gate lengths are different from each other.

In one embodiment of the present invention, the first gate length is substantially similar to a target gate length, the second gate length is larger than the first, third and fourth gate lengths, the third gate length is smaller than the first and the second gate lengths and the fourth gate length is smaller than the first, the second and the third gate lengths. The target gate length may be about 0.25 micrometer or about 0.35 micrometer.

The second gate length may be larger than the target gate length by about 10% of the target gate length. The third gate length may be smaller than the target gate length by about 10% of the target gate length. The integrated circuit substrate may be a semiconductor wafer.

The step of masking may include depositing a layer of photoresist on the gate layer and exposing the photoresist to radiation that is shown through the reticle. The radiation may be generated by a ultraviolet light source. The radiation passing through the reticle may be directed by a stepper.

In another aspect, the present invention provides a process of forming on an integrated circuit substrate at least two die having different gate lengths. The process includes: (i) providing the integrated circuit substrate having a surface; (ii) depositing on the surface a gate layer; (iii) masking portions of the gate layer using a reticle having at least two die patterns including a first die pattern defining an image of a first gate electrode having a first length and a second die pattern defining an image of a second gate electrode having a second length, the first length being different from the second length and relative positioning of the image of the first gate electrode in the first die pattern and of the image of second gate electrode in the second die pattern is substantially similar; and (iv) etching unmasked portions of the gate layer to form on the integrated circuit substrate at least two die including a first die having the first gate electrode with a first gate length and a second die having a second gate electrode with a second gate length, the first gate length being different from the second length.

In the step of masking portions of the gate layer, the reticle may further include a third die pattern defining an image of a third gate electrode having a third length and a fourth die pattern defining an image of a fourth gate electrode having a fourth length, the first, second, third and fourth lengths are different from each other and the step of etching unmasked portions of the gate layer may include forming on the integrated circuit substrate along with the first and second die, a third die having the third gate electrode with a third gate length and a fourth die having the fourth gate electrode with a fourth gate length such that first, second, third and fourth gate lengths are different from each other and relative positioning of the image of the first gate electrode in the first die pattern, the image of the third gate electrode in the third die pattern and the image of the fourth gate electrode in the fourth die pattern are substantially similar.

The process may further include: labeling the first, second, third and fourth die at a scribe region near or on the first, second third and fourth die, respectively; cutting the substrate into units of die; packaging the units of die; and testing the units of die to obtain die performance data. The target gate length may be about 0.25 micrometer or about 0.35 micrometer. The second gate length is larger than the target gate length by about 10% of the target gate length. The third gate length is smaller than the target gate length by about 10% of the target gate length and the fourth gate length is smaller than the target gate length by about 20% of the target gate length. The gate layer may be deposited on a gate oxide that is grown on the substrate surface.

In yet another aspect, the present invention provides a semiconductor substrate including gate electrodes with skewed gate lengths. The semiconductor substrate includes: a first die having a first gate electrode processed to have a first gate length; and a second die having a second gate electrode processed to have a second gate length, wherein the first gate length is different from the second gate length and the relative positioning of the first gate electrode in the first die and the second gate electrode in the second die are substantially similar.

The semiconductor substrate may further include a third die having a third gate electrode processed to have a third gate length and a fourth die having a fourth gate electrode processed to have a fourth gate length, wherein the first gate length, the second gate length, the third gate length and the fourth gate length are different from each other and the relative positioning of the first gate electrode in the first die, the third gate electrode in the third die and the fourth gate electrode in the fourth die are substantially similar.

According to one embodiment of the present invention, the first gate length is substantially similar to a target gate length. The target gate length may be about 0.25 micrometer or about 0.35 micrometer. The second gate length is larger than the first, the third and the fourth gate lengths. The second gate length is larger relative to the target gate length by about 10% of the target gate length. The third gate length is smaller than the first and the second gate lengths. The third gate length is smaller relative to the target gate length by about 10% of the target gate length. The fourth gate length is smaller than the first, the second and the third gate lengths. The fourth gate length is smaller relative to the target gate length by about 20% of the target gate length.

The present invention represents a marked improvement over the current process of fabricating wafer skew lots. By way of example, one wafer or at most one wafer lot may be processed to obtain the perfomance or speed data from the skew lots. As a result, the present invention significantly lowers the cost of generating skew lots and increases the throughput of the semiconductor fabrication process.

As another example, all the die with the different values of the critical dimension are fabricated on the same wafer under the same processing conditions so that process or lot variables are not introduced during fabrication of skew lots.

As yet another example, relative to the current process of generating wafer skew lots by process changes, the present invention generates more accurate skew lots because the present invention uses a special reticle that has different magnitudes of a critical dimension within the same reticle field.

These and other features of the present invention will be described in more detail below in the detailed description of the invention and in conjunction with the following figures.

DETAILED DESCRIPTION OF THE PREFERRED EMBODIMENTS

The present invention provides skew lots on a single wafer by using a single reticle having different values for a critical dimension, such as the gate length, within the same reticle field. In the following description, numerous specific details are set forth in order to fully illustrate a preferred embodiment of the present invention. It will be apparent, however, that the present invention may be practiced without limitation to some specific details presented herein. By way of example, the description of the present invention refers to a semiconductor wafer, however, any integrated circuit substrate will work.

Figure 1:
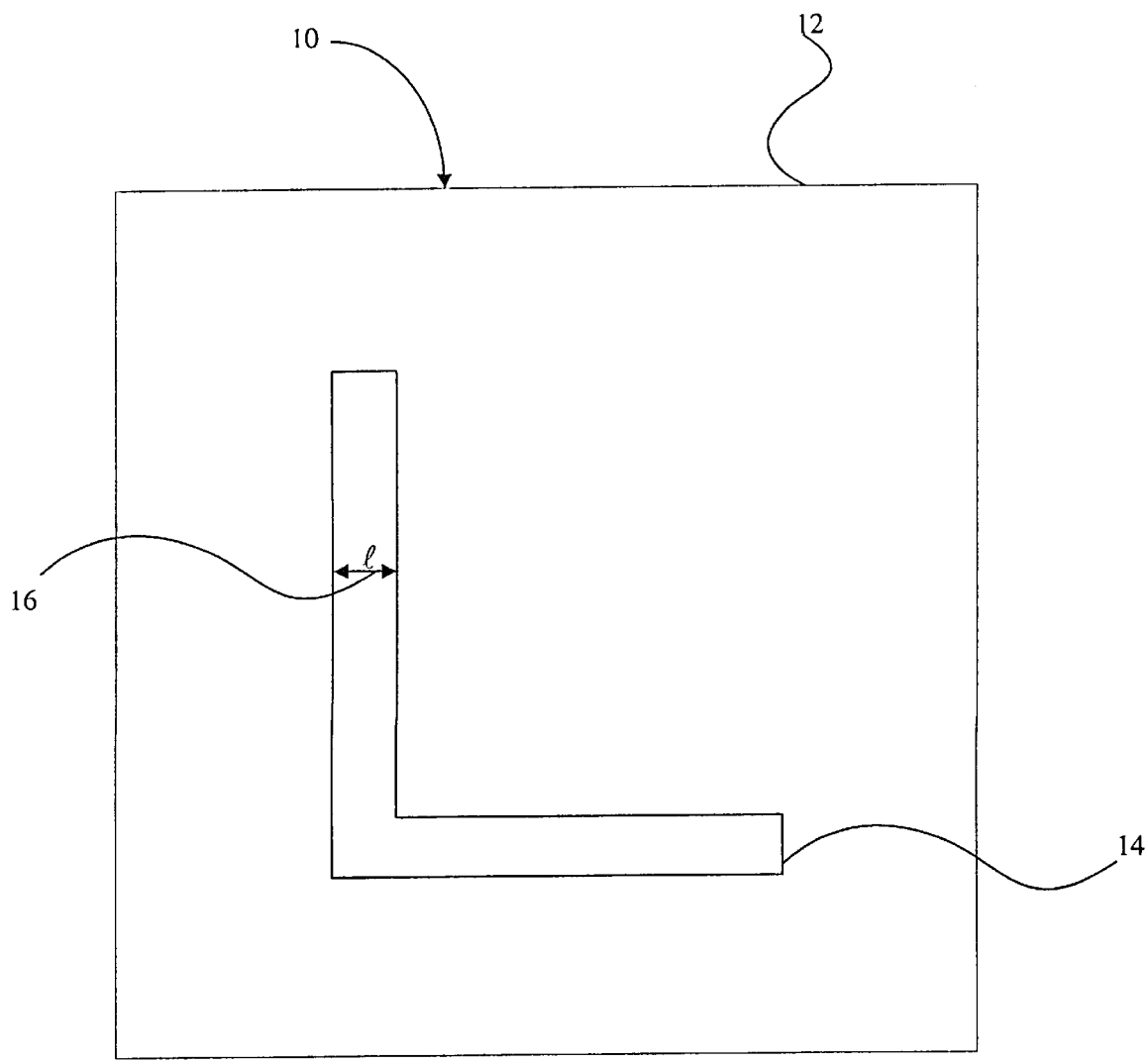
FIG. 1 shows a top view of a portion of a partially fabricated die having an "L" shaped gate electrode.
Figure 2:
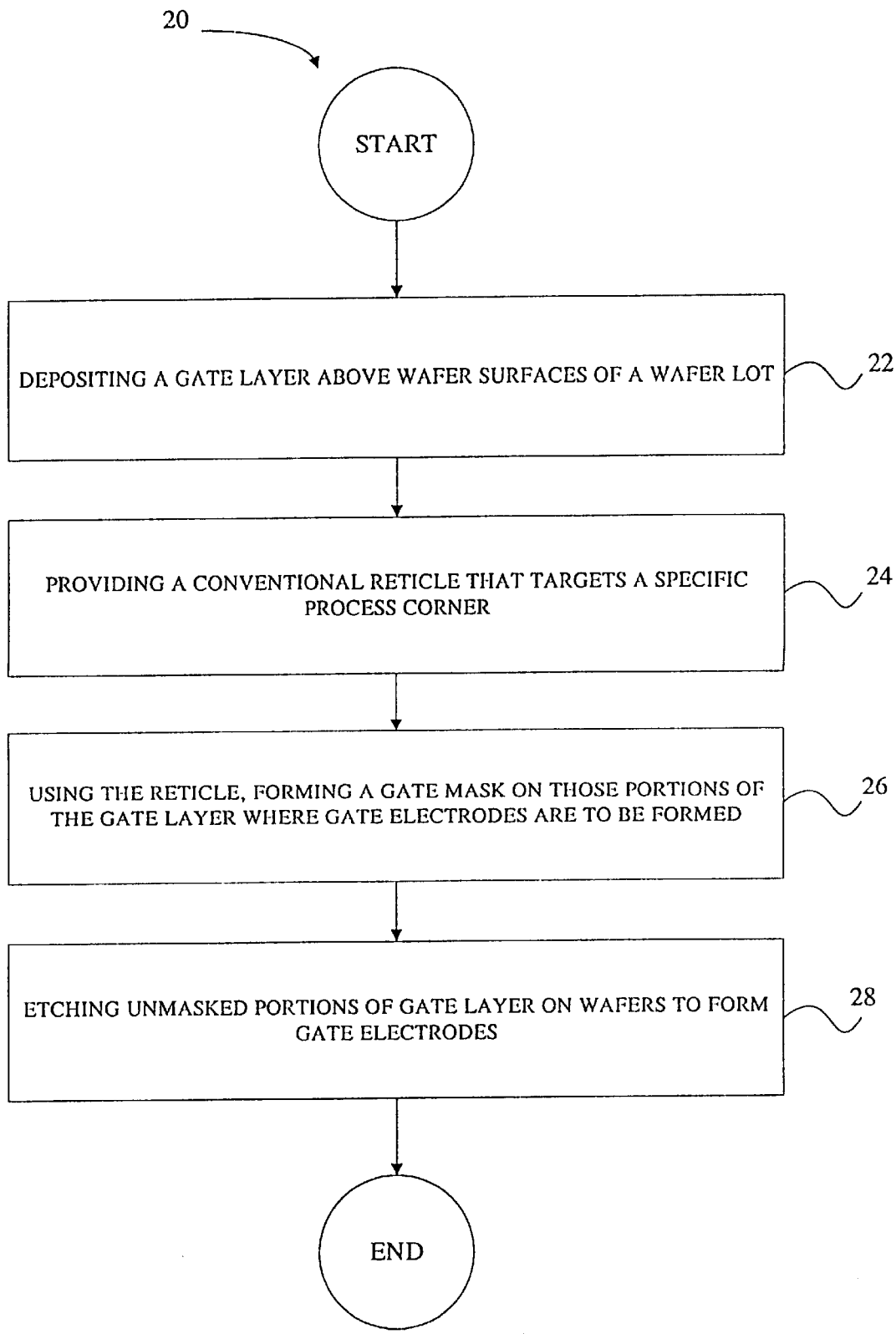
FIG. 2 is a flowchart of a current process of fabricating wafer skew lots.
Figure 3:
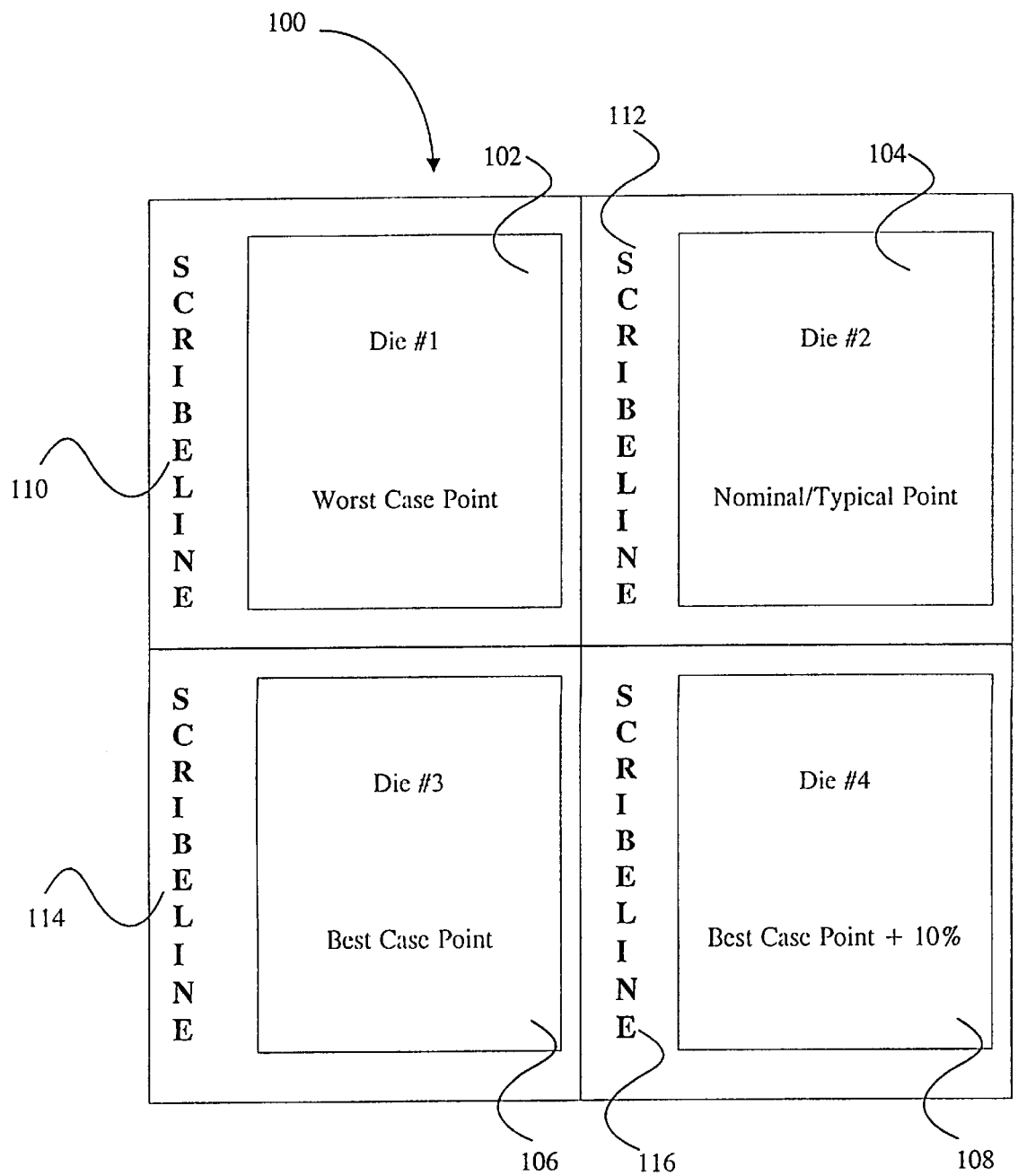
FIG. 3 is a top view of a reticle employed in a preferred embodiment of the present invention.

FIG. 3 shows a reticle 100 employed in a preferred embodiment of the inventive process and has patterns of gate electrodes (not shown to simplify illustration), images of which are transferred onto a wafer surface. A reticle contains transparent and opaque regions which together define a die pattern. Reticles are typically made from a transparent medium such as a borosilicate glass or quartz plate on which is deposited an opaque pattern of chromium or other suitable material. The reticle pattern may be created by a laser or an e-beam direct write technique, for example, both of which are widely used in the art.

A reticle often includes a square pattern of single or multiple die which are exposed simultaneously during the masking step and such a square pattern is referred to as a reticle field. The field of reticle 100 has four different die patterns, i.e. the magnitude of a critical dimension (e.g., a gate length of a particular transistor device) varies from one die pattern to another. The size of that particular gate length in each die pattern may reflect a specific process corner, for example. A die pattern 102 labeled "Die #1" has patterns for gate electrodes at the worst case point, i.e. the gate length of the gate electrodes represent the largest gate length encountered due to process variation relative to the target gate length. A die pattern 104 labeled "Die #2" has patterns for gate electrodes (positioned in die pattern 104 at relatively the same location as gate electrodes of die pattern 102) at the typical/nominal point, i.e. the gate length does not vary or varies from the target gate length by a relatively nominal amount. A die pattern 106 labeled "Die #3" has patterns for gate electrodes at the best case point, i.e. the gate length of the gate electrodes represent the smallest gate length encountered due to process variation relative to the target gate length. A die pattern 108 labeled "Die #4" has patterns for the gate electrode at the best case point plus 10%, which refers to a gate length that is 10% smaller than the best case point. Those skilled in the art will recognize that the relative positioning of the gate electrodes in die pattern 102, 104, 106 and 108 are substantially similar. In other words, if variation in gate length of gate electrodes in a die's logic area is being tested to characterize the speed and performance of the die, then the pattern for the gate electrodes under consideration in die pattern 102, 104, 106 and 108 are located where the pattern for the die's logic resides.

According to one embodiment of the present invention, the first gate length is substantially similar to a target gate length. The target gate length may be about 0.25 micrometer or about 0.35 micrometer. The second gate length is larger than the first, the third and the fourth gate lengths. The second gate length is larger relative to the target gate length by about 10% of the target gate length. The third gate length is smaller than the first and the second gate lengths. The third gate length is smaller relative to the target gate length by about 10% of the target gate length. The fourth gate length is smaller than the first, the second and the third gate lengths. The fourth gate length is smaller relative to the target gate length by about 20% of the target gate length.

Reticle 100 includes a "scribe line" adjacent each die pattern. The scribe line is a region on the reticle that is typically devoid of any die pattern and after the pattern transfer from the reticle has concluded, units of die are cut along a line in a region exposed to the scribe line region of the reticle and therefore this line does not have any die features. As shown in FIG. 3, die patterns 102, 104, 106 and 108 have adjacent to them scribe lines 110, 112, 114 and 116, respectively.

Figure 4:
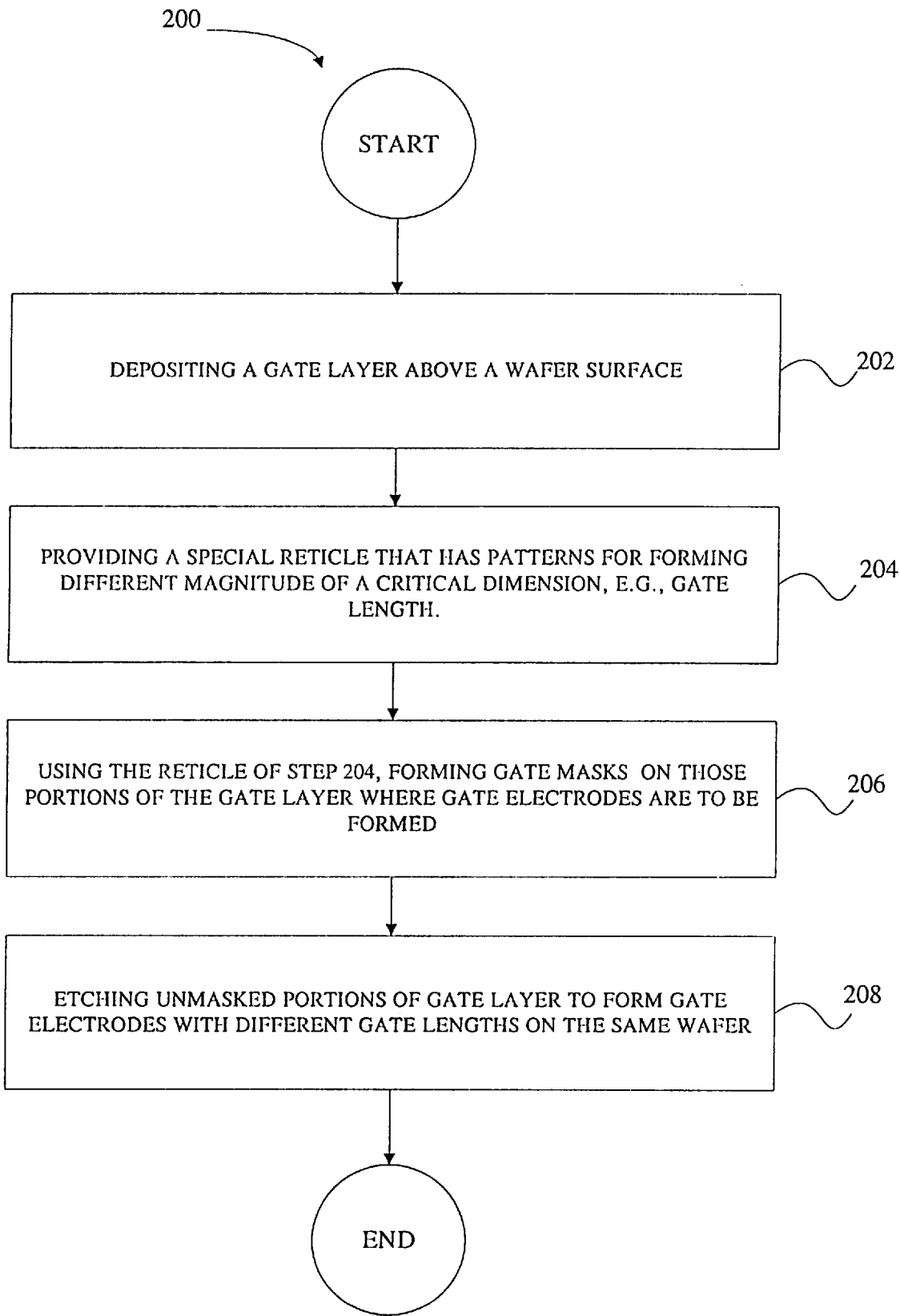
FIG. 4 is a flowchart of a process, according to one embodiment of the present invention, of fabricating skew lots on a single wafer surface.

FIG. 4 is a flowchart of some important steps of the inventive process 200 of generating skew lots on a single wafer. Before process 200 begins, a gate oxide, e.g., silicon dioxide, is grown on a wafer surface according to techniques well known to those skilled in the art. Next, in a step 202 a gate layer, e.g., a polysilicon layer, is blanket deposited on the gate oxide layer.

A step 204 includes providing a special reticle that has patterns for different magnitudes of a critical dimension, e.g., gate length, within the same reticle field. The reticle may include at least two different die patterns within a reticle field such that each of the two die patterns have a critical dimension, i.e. gate lengths, of different magnitudes. By way of example, within the same reticle field, the first die pattern may have images of gate electrodes having a gate length of about 0.35 micrometer and a second die pattern may have images of gate electrodes having a gate length of about 0.40 micrometer. In a preferred embodiment of step 204, however, the reticle shown in FIG. 3 may be provided.

A step 206 then includes using the reticle of step 204 and masking those portions of the gate layer where gate electrodes are to be formed. The process of forming a mask includes blanket depositing a (light sensitive) photoresist layer on the gate layer of step 202. Next, the photoresist is exposed to radiation, such as UV light or the like, shown through a reticle. The radiation passing through the reticle may directed onto a wafer by a projection step-and-repeat machine (stepper). The wafer is held on a support which may move the wafer by translation, rotation, or tilt. In this manner, various regions of the wafer are illuminated at different times. The stepper contains the optical and mechanical elements necessary to take the mask image provided by radiation passing through the reticle, maintain or reduce the image as necessary, and provide the image to the photoresist layer on the wafer. The stepper may reduce the image from the reticle by 1×, 5× or 10×.

The stepper operates by shining radiation through the reticle on one die or a group of adjacent die (a "die field"). This illuminates but a portion of the wafer (one or a few die out of several die located over the entire wafer surface). Then the illuminate of the wafer region is stopped and the stepper moves the image area with respect to the wafer, so that a new region of the wafer comes into the image area. At this point, radiation is again shown through the reticle and projected onto the wafer, this time on the new region of the wafer. This process of illumination and "stepping" characterizes the operation of a stepper. After all the die in the wafer have been exposed, wafer surface with the photoresist is then developed to complete the mask formation, and the surface is ready to undergo etching.

Next, a step 208 includes etching unmasked portions of gate layer to form gate electrodes with different gate lengths on the same wafer. In this step, etchants are introduced on the wafer surface to facilitate etching or the wafer surface is placed in a plasma chamber where it undergoes dry etching. After etching has concluded, the photoresist remaining above the protected portions of the wafer surface is removed by wet chemistry or ashing.

After removal of photoresist layer, conventional "front end" and "back end" IC fabrication steps continue until the die fabrication is completed. Front end steps generally include those steps necessary to form the actual transistor elements such as source/drain regions and isolation regions. Back end steps generally include those steps necessary to create circuitry by wiring the various transistors formed by the front end processing. The circuitry created in the back end steps includes complicated line routing patterns (or "wiring") by the transistors at the die level. The wiring is provided as conductive vertical interconnects and patterned horizontal metallization layers sitting in a layered stack above the wafer. Dielectric layers electrically insulate the metallization layers from one another and from the wafer.

In a preferred embodiment, process 200 further includes a step of labeling the die with letters that would distinguish one die from another in the same die field during wafer sort. Such labeling may be carried out, according to conventional methods well known to those skilled in the art, contemporaneously with step 206 when a gate mask is formed.

Figure 5:
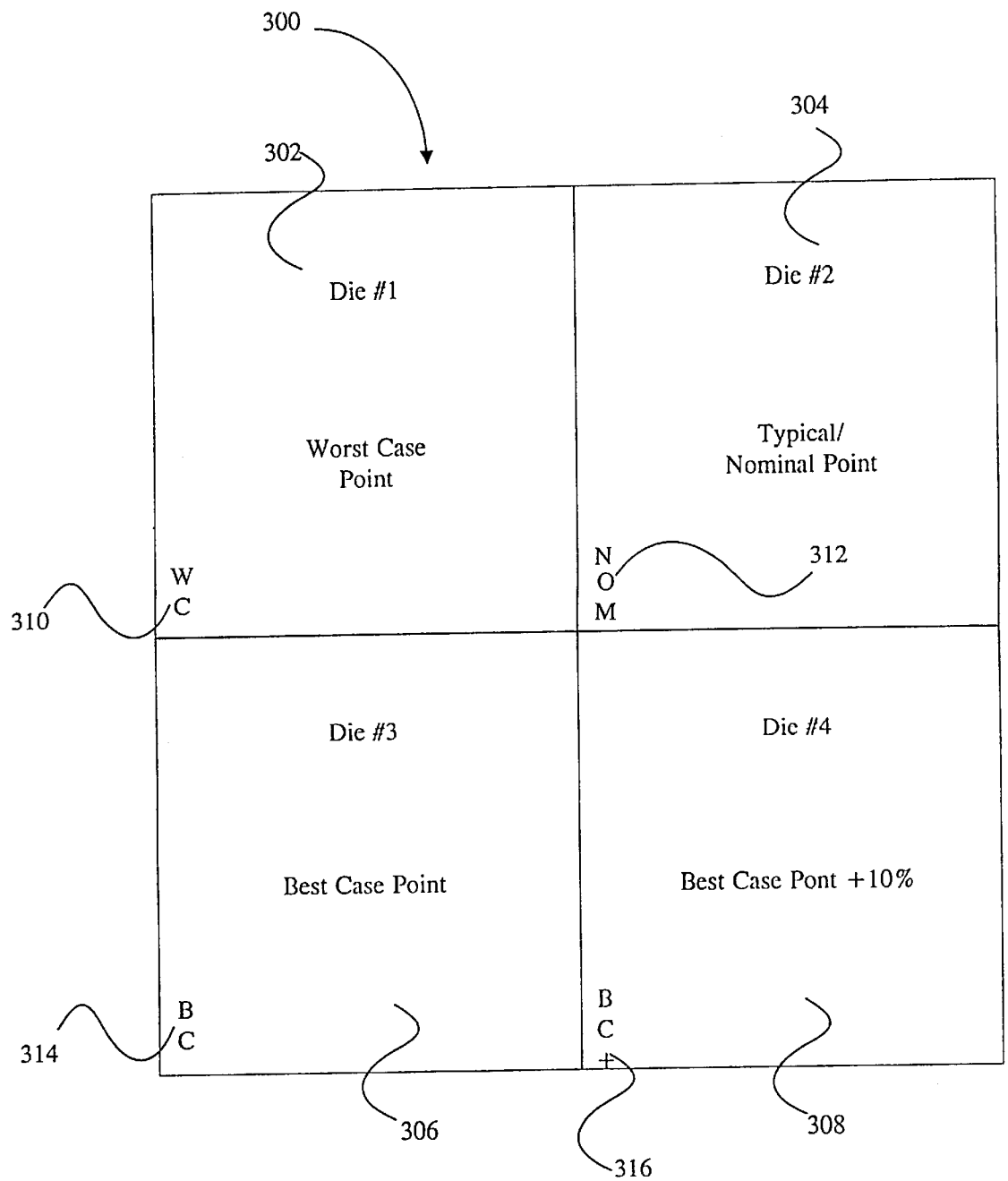
FIG. 5 is a top view of a die field formed on a wafer surface, according to one embodiment of the present invention, by using the reticle of FIG. 3.

FIG. 5 shows a die field 300 formed on a wafer as a result of one embodiment of the inventive process described above. Die field 300 includes four die (302, 304, 306 and 308) labeled "Die #1," "Die #2," "Die #3" and "Die #4," respectively, and processed at different process corners. The die arrangement and characteristics of die field 300 correspond to those of the die patterns in the reticle field of FIG. 3. Die 302 is processed to have gate lengths at the worst case point and is accordingly labeled with initials "WC" at region 310. Die 304 is processed to have gate lengths at the nominal/typical point and is labeled with letters "NOM" (to indicate nominal) at region 312. Die 306 is processed to have gate lengths at the best case point and is accordingly labeled "BC" at region 314 and finally die 308 is processed to have gate lengths at the best case point plus 10% and is labeled as "BC+" at region 316. Thus all the skew lots are formed on the same wafer as opposed to on different wafer lots. Of course, the relative positioning of gate electrodes (whose gate lengths are being skewed) in die 302, 304, 306 and 308 are substantially the same.

The gate lengths for the worst case point are larger than the target gate length by about 10% of the target gate length. The gate lengths for the best case point are smaller than the target gate length by about 10% of the target gate length and the gate lengths for the best case plus 10% are smaller than the target gate length by about 20% of the target gate length.

The wafer surface populated with several of die field 300 of FIG. 5 may be cut into units of die, which may then be assembled in die packages. The packaged die may be sorted according to their label (of "WC," "BC," etc.) and are ready for testing. Performance data is taken on the die during testing. In the event there is a question or uncertainty about the target gate length value, the package lid may be removed to expose the label on the die and a visual verification may be made.

The performance data obtained by the skew lots of the present invention allows a semiconductor fabrication facility to understand the performance limits of their process technology and set viable process limits or tune the process for better performance. The semiconductor fabrication facility may offer their customers an accurate and inexpensive approach to produce die that will give that customer an precise assessment of the process/performance edges for a given process technology. The customer can also use the performance data information to evaluate the performance effects of various devices on their board/system and enhance the speed of their system when required.

The present invention represents a marked improvement over the current process of fabricating wafer skew lots. By way of example, one wafer or at most one wafer lot may be processed to obtain the performance or speed data from the skew lots. As a result, the present invention significantly lowers the cost of generating skew lots and increases the throughput of the semiconductor fabrication process.

As another example, all the die with the different values of the critical dimension are fabricated on the same wafer under the same processing conditions so that process or lot variables are not introduced during fabrication of skew lots.

As yet another example, relative to the current process of generating wafer skew lots by process changes, the present invention generates more accurate skew lots because the present invention uses a special reticle that has different magnitudes of a critical dimension within the same reticle field.

Although the foregoing invention has been described in some detail for purposes of clarity of understanding, it will be apparent that certain changes and modifications may be practiced within the scope of the appended claims. For example, while the specification describes gate length as the critical dimension of concern, there is no reason why in principle other critical dimensions, such as channel length or trench depth may not varied to generate skew lots. Therefore, the present embodiments are to be considered as illustrative and not restrictive, and the invention is not to be limited to the details given herein, but may be modified within the scope of the appended claims.

What is claimed is:

1. A process of generating a wafer skew lot including forming on an integrated circuit substrate at least two different gate masks having different lengths, said process comprising:

provided the integrated circuit substrate having a surface;

depositing on the surface a gate layer; and masking portions of the gate layer using a reticle having at least two die patterns including a first die pattern defining an image of a first gate electrode having a first length in a first die and a second die pattern defining an image of a second gate electrode having a second length in a second die, said first length being different from said second length wherein the first die pattern and second die pattern are substantially similar and the relative positioning of said image of said first gate electrode in said first die pattern corresponds to said image of said second gate electrode in said second die pattern, thereby generating a wafer skew lot.

2. The process of claim 1, further comprising etching unmasked portions of said gate layer to form on the integrated circuit substrate at least two die including a first die having said first gate electrode with a first gate length and a second die having a second gate electrode with a second gate length, said first gate length being different from said second length.

3. The process of claim 1, wherein the gate layer includes a polysilicon layer.

4. The process of claim 1, wherein the gate layer is deposited on a gate oxide that is grown on the substrate surface.

5. The process of claim 1, further comprising:

labeling the first and second die at a scribe region near or on the first and second die based on the first gate length of the first gate electrode and the second gate length of the second gate electrode.

6. The process of claim 5, further comprising:

cutting the substrate into units of die;

packaging the first and second die; and testing the first and second die to obtain die performance data.

7. The process of claim 1, wherein in said masking portions of the gate layer, the reticle further includes a third die pattern defining an image of a third gate electrode having a third length and a fourth die pattern defining an image of a fourth gate electrode having a fourth length, said first, second, third and fourth lengths are different from each other and relative positioning of said image of said first gate electrode in said first die pattern, of said image of said third gate electrode in said third die pattern and of said image of said fourth gate electrode in said fourth die pattern are substantially similar and in said etching unmasked portions of the gate layer, forming on the integrated circuit substrate along with the first and second die, a third die having said third gate electrode with a third gate length and a fourth die having said fourth gate electrode with a fourth gate length such that first, second, third and fourth gate lengths are different from each other.

8. The process of claim 7, wherein the first gate length is substantially similar to a target gate length, the second gate length is larger than the first, the third or the fourth gate lengths, the third gate length is smaller than the first and the second gate lengths and the fourth gate length is smaller than the first, the second and the third gate lengths.

9. The process of claim 8, wherein the target gate length is about 0.25 micrometer or about 0.35 micrometer.

10. The process of claim 8, wherein the second gate length may be larger than the target gate length by about 10% of the target gate length.

11. The process of claim 8, wherein the third gate length may be smaller than the target gate length by about 10% of the target gate length.

12. The process of claim 1, wherein the fourth gate length may be smaller than the target gate length by about 20% of the target gate length.

13. The process of claim 1, wherein said masking includes:

depositing a layer of photoresist on the gate layer; and exposing the photoresist to radiation that is shown through the reticle.

14. The process of claim 13, wherein radiation is generated by a ultraviolet light source.

15. The process of claim 13, wherein the radiation passing through the reticle is directed by a stepper.

16. A process of generating a wafer skew lot including forming on an integrated circuit substrate at least two die having different gate lengths, said process comprising:

providing the integrated circuit substrate having a surface:

depositing on the surface a gate layer:

masking portions of the gate layer using a reticle having at least two die patterns including a first die pattern defining an image of a first gate electrode having a first length in a first die and a second die pattern defining an image of a second gate electrode having a second length in a second die, said first length being different from said second length wherein the first die pattern and second die pattern are substantially similar and the relative positioning of said image of said first gate electrode in said first die patter corresponds to said image of said second gate electrode in said second die pattern; and etching unmasked portions of said gate layer to form on the integrated circuit substrate at least two die including a first die having said first gate electrode with a first gate length and a second die having a second gate electrode with a second gate length, said first gate length being different from said second length, thereby generating a wafer skew lot.

17. The process of claim 16, wherein in said masking portions of the gate layer, the reticle further includes a third die pattern defining an image of a third gate electrode having a third length and a fourth die pattern defining an image of a fourth gate electrode having a fourth length, said first, second, third and fourth lengths are different from each other and relative positioning of said image of said first gate electrode in said first die pattern, of said image of said third gate electrode in said third die pattern and of said image of said fourth gate electrode in said fourth die pattern are substantially similar and in said etching unmasked portions of the gate layer, forming on the integrated circuit substrate along with the first and second die, a third die having said third gate electrode with a third gate length and a fourth die having said fourth gate electrode with a fourth gate length such that first, second, third and fourth gate lengths are different from each other.

18. The process of claim 17 further comprising:

labeling the first, second, third and fourth die at a scribe region near or on the first, second third and fourth die, respectively;

cutting the substrate into units of die;

packaging said units of die; and testing said units of die to obtain die performance data.

19. The process of claim 18, wherein the second gate length is larger than a target gate length by about 10% of the target gate length.

20. The process of claim 18, wherein the third gate length is smaller than a target gate length by about 10% of the target gate length.

21. The process of claim 18, wherein the fourth gate length is smaller than a target gate length by about 20% of the target gate length.

22. The process of claim 19, wherein the target gate length is about 0.25 micrometer or about 0.35 micrometer.

23. The process of claim 16, wherein the gate layer is deposited on a gate oxide that is grown on the substrate surface.

* * * * *